US012211670B2

(12) United States Patent
Zhang et al.

(10) Patent No.: US 12,211,670 B2
(45) Date of Patent: *Jan. 28, 2025

(54) PERFORMING RADIO FREQUENCY MATCHING CONTROL USING A MODEL-BASED DIGITAL TWIN

(71) Applicant: APPLIED MATERIALS, INC., Santa Clara, CA (US)

(72) Inventors: Tao Zhang, San Ramon, CA (US); Upendra Ummethala, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/377,918

(22) Filed: Oct. 9, 2023

(65) Prior Publication Data

US 2024/0162009 A1 May 16, 2024

Related U.S. Application Data

(63) Continuation of application No. 17/133,787, filed on Dec. 24, 2020, now Pat. No. 11,784,028.

(51) Int. Cl.
*H01J 37/32* (2006.01)
*H03H 7/40* (2006.01)
*H05H 1/46* (2006.01)

(52) U.S. Cl.
CPC ...... *H01J 37/32183* (2013.01); *H01J 37/321* (2013.01); *H01J 37/32926* (2013.01);
(Continued)

(58) Field of Classification Search
None
See application file for complete search history.

(56) References Cited

U.S. PATENT DOCUMENTS 5,654,679 A * 8/1997 Mavretic .......... H03H 7/40
333/32
5,770,982 A * 6/1998 Moore .......... H01F 21/08
323/308

(Continued)

FOREIGN PATENT DOCUMENTS

JP 2019133785 A 8/2019
KR 20170103660 A 9/2017

(Continued)

OTHER PUBLICATIONS

International Preliminary Report on Patentability for International Application No. PCT/US2021/064673, mailed Jul. 6, 2023, 6 Pages.

(Continued)

*Primary Examiner* — Srinivas Sathiraju
(74) *Attorney, Agent, or Firm* — Lowenstein Sandler LLP

(57) ABSTRACT

A method includes receiving, from one or more sensors, sensor data associated with manufacturing equipment and updating one or more values of a digital replica associated with the manufacturing equipment based on the sensor data. The digital replica comprises a model reflecting a virtual representation of physical elements and dynamics of how the manufacturing equipment operates. One or more outputs indicative of predictive data is obtained from the digital replica and, based on the predictive data, performance of one or more corrective actions associated with the manufacturing equipment is caused.

17 Claims, 7 Drawing Sheets

(52) U.S. Cl.
CPC ......... *H01J 37/32935* (2013.01); *H03H 7/40* (2013.01); *H05H 1/46* (2013.01); *H05H 1/4652* (2021.05)

(56) References Cited

U.S. PATENT DOCUMENTS

| | | | | |
|---|---|---|---|---|
| 5,815,047 | A * | 9/1998 | Sorensen | H03H 7/40 333/32 |
| 7,042,311 | B1 * | 5/2006 | Hilliker | H01J 37/32183 333/133 |
| 7,906,032 | B2 * | 3/2011 | Yamashita | B08B 7/00 156/345.24 |
| 9,385,891 | B2 * | 7/2016 | Boggan | H04L 25/0266 |
| 9,770,211 | B2 * | 9/2017 | Hayter | A61B 5/14532 |
| 9,804,148 | B2 * | 10/2017 | Hayter | A61B 5/14546 |
| 9,833,181 | B2 * | 12/2017 | Hayter | A61B 5/14532 |
| 10,304,663 | B1 * | 5/2019 | Kapoor | H01L 21/67201 |
| 10,304,669 | B1 * | 5/2019 | Coumou | H01J 37/32174 |
| 10,741,362 | B2 * | 8/2020 | Miki | H03H 7/38 |
| 11,784,028 | B2 * | 10/2023 | Zhang | H01J 37/32926 315/111.21 |
| 2003/0184319 | A1 | 10/2003 | Nishimori et al. | |
| 2005/0011451 | A1 * | 1/2005 | Blackburn | H01J 37/32183 118/723 E |
| 2005/0057165 | A1 * | 3/2005 | Goodman | H01J 37/32935 315/111.51 |
| 2005/0106873 | A1 * | 5/2005 | Hoffman | H01J 37/32091 438/689 |
| 2005/0128160 | A1 * | 6/2005 | Howald | H01J 37/321 343/866 |
| 2005/0168152 | A1 * | 8/2005 | Blackburn | H01J 37/32082 315/111.21 |
| 2006/0165146 | A1 * | 7/2006 | Backes | G01C 19/66 356/459 |
| 2007/0238199 | A1 * | 10/2007 | Yamashita | C23C 16/4404 257/E21.311 |
| 2008/0061793 | A1 * | 3/2008 | Anwar | G01R 31/1254 324/555 |
| 2009/0048792 | A1 * | 2/2009 | Turner | H01J 37/3299 315/111.21 |
| 2009/0055149 | A1 * | 2/2009 | Hayter | G16H 40/67 703/11 |
| 2010/0243606 | A1 * | 9/2010 | Koshimizu | H01J 37/32091 156/345.44 |
| 2012/0168081 | A1 * | 7/2012 | Son | H01J 37/321 156/345.28 |
| 2014/0334209 | A1 * | 11/2014 | Li | H01J 37/32935 363/126 |
| 2016/0013953 | A1 * | 1/2016 | Boggan | H01P 3/081 327/551 |
| 2016/0085584 | A1 * | 3/2016 | Pedersen | G06N 5/02 718/102 |
| 2017/0330876 | A1 * | 11/2017 | Leedy | G02B 6/12002 |
| 2018/0293103 | A1 * | 10/2018 | Kalmus | G06F 9/5005 |
| 2019/0103293 | A1 * | 4/2019 | Kim | H01L 21/67069 |
| 2020/0075291 | A1 | 3/2020 | Miki | |
| 2020/0080202 | A1 * | 3/2020 | Akashi | C23C 16/52 |
| 2020/0226742 | A1 * | 7/2020 | Sawlani | H01L 21/67288 |
| 2021/0142986 | A1 * | 5/2021 | Bhutta | H01L 21/67069 |
| 2021/0305018 | A1 * | 9/2021 | Bhutta | H03H 7/40 |
| 2022/0066411 | A1 * | 3/2022 | Ummethala | G05B 19/401 |
| 2022/0208520 | A1 * | 6/2022 | Zhang | H01J 37/32926 |
| 2022/0254610 | A1 * | 8/2022 | Bhutta | H01L 21/02274 |
| 2023/0236586 | A1 * | 7/2023 | Cheon | G05B 13/0265 700/110 |
| 2023/0237412 | A1 * | 7/2023 | Cheon | G06N 3/084 705/7.38 |
| 2023/0259112 | A1 * | 8/2023 | Cheon | G05B 19/4184 |
| 2023/0390886 | A1 * | 12/2023 | Ummethala | H01L 22/26 |

FOREIGN PATENT DOCUMENTS

| | | | | |
|---|---|---|---|---|
| KR | 20190038070 A | 4/2019 | | |
| WO | 2018101722 A2 | 6/2018 | | |
| WO | WO-2022140431 A1 * | 6/2022 | | H01J 37/321 |

OTHER PUBLICATIONS

International Search Report And Written Opinion for International Application No. PCT/US2021/064673, mailed Apr. 15, 2022, 9 Pages.

Extended European Search Report for European Application No. 21912066.4, mailed Dec. 6, 2024, 9 Pages.

* cited by examiner

PERFORMING RADIO FREQUENCY MATCHING CONTROL USING A MODEL-BASED DIGITAL TWIN

RELATED APPLICATION

This application a continuation of U.S. patent application Ser. No. 17/133,787, filed Dec. 24, 2020, the entire contents of which is hereby incorporated by reference herein.

TECHNICAL FIELD

The present disclosure relates to electrical components, and, more particularly, to performing radio frequency matching control using a model-based digital twin.

BACKGROUND

Products may be produced by performing one or more manufacturing processes using manufacturing equipment. For example, semiconductor manufacturing equipment may be used to produce semiconductor devices (e.g., substrates, wafers, etc.) via semiconductor manufacturing processes. In the conventional radio frequency (RF) plasma etching process used during stages of fabrication of many semiconductor devices, an RF signal may be provided to a substrate processing chamber via an RF energy source. The RF signal may be generated and provided in continuous or pulsed wave modes. Due to mismatches between the impedance of the RF energy source and the plasma formed in the processing chamber, some of the RF signal is reflected back to the RF energy source, which results in inefficient use of the RF signal and wasting energy, potential damage to RF energy source, and potential inconsistency/non-repeatability issues with respect to substrate processing. Thus, a RF matching control system is capable of achieving high repeatability of delivering RF signal is desirable.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a system includes a memory; and a processing device, coupled to the memory, to receive, from one or more sensors, sensor data associated with manufacturing equipment and update one or more values of a digital replica associated with the manufacturing equipment based on the sensor data, wherein the digital replica comprises a model reflecting a virtual representation of physical elements and dynamics of how the manufacturing equipment operates. The processor further obtains, from the digital replica, one or more outputs indicative of predictive data and causes, based on the predictive data, performance of one or more corrective actions associated with the manufacturing equipment.

A further aspect of the disclosure includes a method according to any aspect or implementation described herein.

A further aspect of the disclosure includes a non-transitory computer-readable storage medium comprising instructions that, when executed by a processing device operatively coupled to a memory, performs operations according to any aspect or implementation described herein.

BRIEF DESCRIPTION OF THE DRAWINGS

The present disclosure is illustrated by way of example, and not by way of limitation in the figures of the accompanying drawings.

DETAILED DESCRIPTION

Figure 1:
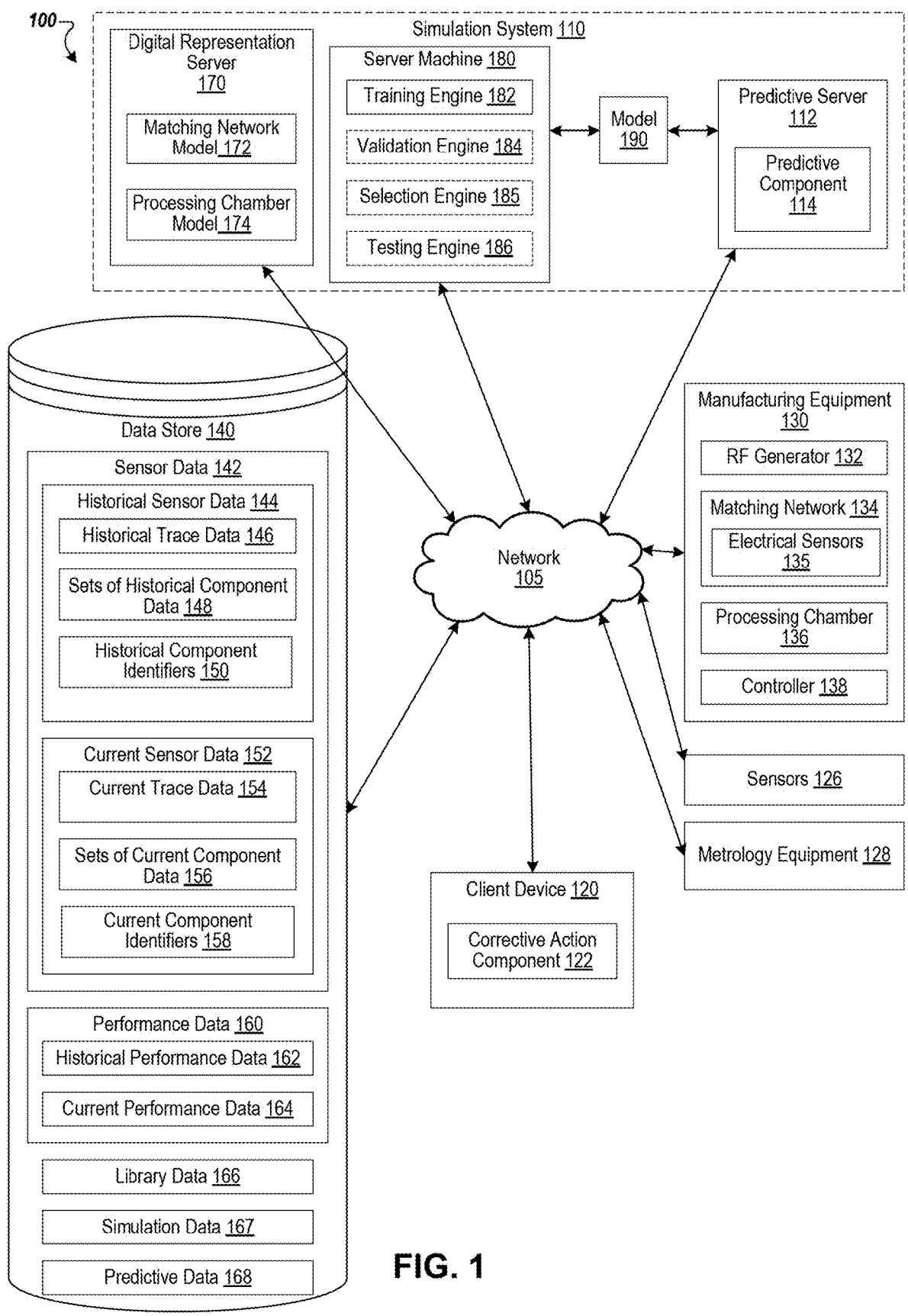
FIG. 1 is a block diagram illustrating an exemplary system architecture, according to certain embodiments.

Described herein are technologies directed to performing radio frequency matching control using a model-based digital twin. Manufacturing equipment may be used to produce products (e.g., wafers). For example, manufacturing equipment may execute a recipe to produce wafers by suppling RF energy, in the form of an RF signal, to a processing chamber to generate plasma for etching. The RF signal is often coupled to the plasma in the processing chamber through a fixed or tunable matching network that operates to minimize the reflected RF signal by more closely matching the impedance of the plasma to the impedance of the RF energy source. The matching network allows the output of the RF source to be efficiently coupled to the plasma to maximize the amount of energy coupled to the plasma. Thus, the matching network allows for the total impedance (e.g., plasma impedance, chamber impedance, and matching network impedance) to be the same as or similar to the output impedance of the RF power delivery.

In some conventional systems, RF match control profiles for the matching network are designed based on lookup tables. The lookup tables may be associated with processing parameters, such as the type of input frequency (e.g., 2.2 MHz, 13.56 MHz, etc.) used energize the processing chamber, the type of processing gas used (e.g., $H_2$, He, Ar, $O_2$, $NF_3$, etc.), the type of processing chamber used, etc. The control profiles can be used to adjust the one or more variable tuning elements of the matching network, such as a variable capacitor, variable inductor, or variable resistor. When the parameters of the matching network or processing chamber change (due to temperature, aging effects, corrosion, parts failure, degradation, etc.), the control profile selected using the lookup tables may not deliver optimal results.

The devices, systems, and methods disclosed herein provide real-time optimization of a control profile using current sensor data to achieve maximum power delivery with minimum tuning time. In one embodiment, a processing device causes manufacturing equipment to generate a RF signal to energize a processing chamber associated with the manufacturing equipment. The processing device may receive, from one or more sensors associated with the manufacturing equipment, current trace data (e.g., voltage, current, etc.) associated the RF signal. The processing device may then update impedance values of a digital replica associated with the manufacturing equipment based on the current trace data. Outputs indicative of predictive data may be obtained from the digital replica. The outputs indicative of predictive data may be generated using a trained machine learning model, a heuristics model, or a rule based model. Based on the predictive data, the processing device may perform one or more corrective actions associated with the manufacturing equipment.

In some embodiments, the matching network may include two adjustable (tunable) capacitors. The predictive data may include one or more tune settings for the capacitors. The tune settings may be a function of the reflective coefficient associated with the reflected RF signal and a time parameter. The corrective action may include adjusting either or both of the adjustable capacitors based on the predictive data.

In some embodiments, the processing device can update the digital replica in real-time using the current trace data. For example, responsive to determining that digital replica fails to satisfy an accuracy threshold criterion based on the current trace data, the processing logic can perform an optimization of the digital replica.

In some embodiments, the matching network may include an input impedance sensor and an output impedance sensor. Updating the impedance values of the digital replica may include updating a processing chamber model associated with the digital replica using the current trace data from the output impedance sensor. Updating the impedance values of the digital replica may further include updating a matching network model associated with the digital replica using current trace data from the input impedance sensor and the output impedance sensor.

Aspects of the present disclosure result in technological advantages of significant reduction in time required to achieve optimal settings, energy consumption, bandwidth used, processor overhead, and so forth. For example, conventional systems perform iterations of trial and error to attempt to improve high repeatability in delivering optimal RF power. This trial-and-error process requires more and more time, energy consumption, bandwidth, and processor overhead for each iteration (e.g., generating instructions via trial and error, transmitting the instructions, receiving feedback, generating updated instructions via trial and error, and so forth). The present disclosure results in reduced time requirements, energy consumption, bandwidth, and processor overhead by using signal processing, a digital replica, and a machine learning model to obtain predictive data and cause performance of corrective actions based on the predictive data and avoiding iterations of trial and error. The present disclosure may result in predicting optimal parameter settings associated with the matching network to avoid inconsistent and abnormal products, unscheduled user time, and damage to manufacturing equipment.

FIG. 1 is a block diagram illustrating an exemplary system 100 (exemplary system architecture), according to certain embodiments. The system 100 includes a simulation system 110, a client device 120, sensors 126, manufacturing equipment 130, metrology equipment 128, and a data store 140. The simulation system 110 may include a digital representation server 170, a server machine 180, and a predictive server 112.

The manufacturing equipment 130 can include RF generator 132, matching network 134, process chamber 136, and controller 138. A RF signal may be generated by the RF generator 132 and transmitted to the matching network 134. The RF signal may then be applied to the processing chamber 136 to ignite and maintain plasma used for an etching process. In some embodiments, the RF generator 132 may generate one or more of a low RF signal (e.g., 2.2 MHz, 13.56 MHz, etc.) to energize the processing chamber 136, one or more of a high RF signal (e.g., 24 MHz, 60 MHz, 100 MHz, etc.) to energize the processing chamber 136, or any combination thereof. The RF generator 132 may have capabilities of pulsing the RF signal at a desired pulse rate, duty cycle, and phase angle. The controller 138 may be connected to the RF power generator 132 and RF matching network 134, and may control (e.g., initiate, switch, shut off, etc.) the RF signal of the RF generator 132. Further, the controller 138 may be used to adjust the pulse rate, duty cycle, and phase angle of the RF signal.

The matching network 134 may operate to minimize reflected RF energy by matching the impedance of the plasma used in the etching process to the impedance of the RF signal (e.g., 50 Ohms) supplied by the RF generator 132. The matching network 134 may include an arrangement of capacitive, inductive, and resistive elements. In order to vary its parameters, the matching network 134 may include one or more controllable adjustable or variable tuning elements, such as a variable capacitor, inductor, or resistor, or a combination thereof. For example, the matching network 134 can include a variable shunt capacitor and a variable series capacitor, both of which function as the variable tuning element. The variable (e.g., tuning or tunable) capacitor may be a motorized vacuum capacitor operated by the controller 138, or any other controllable variable capacitor. In an embodiment, the matching network 134 may tune one or more of the controllable variable tuning elements such that the impedance associated with the matching network 134 and/or the processing chamber 136 is increased/decreased towards the impedance associated with the RF generator 132 (e.g., 50 Ohms).

The RF matching network 134 may also include one or more electrical sensors 135, which may be any type of RF voltage/current measurement device (e.g., a sensor, a probe, etc.) capable of providing sensor data 142 (e.g., sensor values, features, trace data). In some embodiments, the electrical sensors 135 perform electrical measurements of an electrical feed conductor (e.g., electrical feed lines) coupled to the RF generator 132, the matching network 134, and/or the process chamber 136. The electrical sensors 135 sense properties of the electrical feed conductor (e.g., impedance, magnetic fluctuations in the electrical feed conductor, electrical current, voltage, resistance, etc.) and convert the properties into sensor data 142 (e.g., trace data, historical trace data 146, current trace data 154). The electrical sensors 135 may also measure values of one or more of electrical current, magnitude of Alternating Current (AC), phase, waveform (e.g., AC waveform, pulse waveform), Direct Current (DC), non-sinusoidal AC waveforms, voltage, or the like.

In an embodiment, the electrical sensors 135 include an input (source) impedance sensor and output (load) impedance sensor. The input impedance sensor may determine the impedance associated with the RF signal at the matching network 134. The output impedance sensor may determine the impedance of the RF signal at a destination (e.g., the processing chamber 136). The manufacturing equipment 130 will be described in greater detail in regards to FIG. 2.

The sensors 126 may provide sensor data 142 (e.g., sensor values, features, trace data) associated with manufacturing equipment 130 (e.g., associated with producing, by manufacturing equipment 130, corresponding products, such as wafers). The sensor data 142 may be used for equipment health and/or product health (e.g., product quality). The manufacturing equipment 130 may produce products following a recipe or performing runs over a period of time. Sensor data 142 received over a period of time (e.g., corresponding to at least part of a recipe or run) may be referred to as trace data (e.g., historical trace data 146, current trace data 154) received from different sensors 126 over time.

The sensors 126 may include additional sensors that provide other types of sensor data 142. In some embodiments, the sensor data 142 may include values of one or more of temperature (e.g., heater temperature), spacing (SP), pressure, High Frequency Radio Frequency (HFRF), voltage of Electrostatic Chuck (ESC), electrical current, flow, power, voltage, etc. Sensor data 142 may be associated with or indicative of manufacturing parameters such as hardware parameters (e.g., settings or components (e.g., size, type, etc.) of the manufacturing equipment 130) or process parameters of the manufacturing equipment. The sensor data 142 may be provided while the manufacturing equipment 130 is performing manufacturing processes (e.g., equipment readings when processing products). The sensor data 142 may be different for each product (e.g., each wafer).

In some embodiments, the sensor data 142 (e.g., historical trace data 146, sets of historical component data 148, current trace data 154, sets of current component data 156, etc.) may be processed (e.g., by the client device 120 and/or by components of the simulation system 110). Processing of the sensor data 142 may include generating features. In some embodiments, the features are a pattern in the sensor data 142 (e.g., slope, width, height, peak, etc.) or a combination of sensor values from the sensor data 142 (e.g., impedance derived from voltage and current measurements, etc.). The sensor data 142 may include features and the features may be used by components of the simulation system 110 for performing simulation processing and/or for obtaining simulation data 167 and/or predictive data 168 for performance of a corrective action.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). The data store 140 may store sensor data 142, performance data 160, library data 166, simulation data 168, and predictive data 169. Sensor data 142 may include historical sensor data 144 and current sensor data 152. Historical sensor data may include historical trace data 146, sets of historical component data 148, and historical component identifiers 150. Current sensor data 152 may include current trace data 154, sets of current component data 156, and current component identifiers 158. Performance data 160 may include historical performance data 162 and current performance data 164. The historical sensor data 144 and historical performance data 162 may be historical data. The current sensor data 144 may be current data for which simulation data 167 and predictive data 168 are to be generated (e.g., for performing corrective actions). The current performance data 164 may also be current data (e.g., for re-training trained machine learning model)

The performance data 160 may include data associated with the manufacturing equipment 130 and/or products produced by the manufacturing equipment 130. In some embodiments, the performance data 160 may include an indication of a lifetime of a component of manufacturing equipment 130 (e.g., time of failure), manufacturing parameters of manufacturing equipment 130, maintenance of manufacturing equipment 130, energy usage of a component of manufacturing equipment 130, variance in components (e.g., of same part number) of manufacturing equipment 130, or the like. Performance data 160 may include an indication of variance in components (e.g., of the same type, of the same part number) of manufacturing equipment. The performance data 160 may indicate if the variance (e.g., jitter, slope, peak, etc.) contributes to product-to-product variation. The performance data 160 may indicate if a variance provides an improved wafer (e.g., RF generator better matched, feedback loop tuned better, newer firmware, better chips). The performance data 160 may be associated with a quality of products produced by the manufacturing equipment 130. The metrology equipment 128 may provide performance data 160 (e.g., property data of wafers, yield, metrology data) associated with products (e.g., wafers) produced by the manufacturing equipment 130. The performance data 160 may include a value of one or more of film property data (e.g., wafer spatial film properties), dimensions (e.g., thickness, height, etc.), dielectric constant, dopant concentration, density, defects, etc. The performance data 160 may be of a finished or semi-finished product. The performance data 160 may be different for each product (e.g., each wafer). The performance data 160 may indicate whether a product meets a threshold quality (e.g., defective, not defective, etc.). The performance data 160 may indicate a cause of not meeting a threshold quality. In some embodiments, the performance data 160 includes historical performance data 162, which corresponds to historical property data of products (e.g., produced using manufacturing parameters associated with historical trace data 146). The sensor data 142, performance data 160, and library data 166 may be used for supervised and/or unsupervised machine learning.

The simulation system 110 may include digital representation server 170, server machine 180, and predictive server 112. The predictive server 112, digital representation server 170, and server machine 180 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The digital representation server 170 may be an algorithmic model that simulates manufacturing equipment 130. By way of example, the digital representation server 170 may be a digital replica model (e.g., a digital twin) of the manufacturing equipment 130. The digital representation server 170 may use supervised machine learning, semi-supervised learning, unsupervised machine learning, or any combination thereof to generate a virtual representation of the physical elements and the dynamics of how the manufacturing equipment 130 operates. The digital representation server 170 may be updated via reinforcement learning using periodic updates from the sensors 126, electrical sensors 135, sensor data 142, performance data 160, library data 166, and/or any other data associated with generating and maintain the digital replica model of the manufacturing equipment 130.

The digital representation server 170 may include a matching network model 172 and a processing chamber model 174. The matching network model 172 may be associated with the physical elements and the dynamics of the matching network 134. The processing chamber model 174 may be associated with the physical elements and the dynamics of the processing chamber 136.

In some embodiments, the digital representation server 170 may generate simulation data 167. Simulation data 167 may include data used to determine how the manufacturing equipment 130 (e.g., matching network 134, processing chamber 136, etc.) would perform based on current or simulated parameters. The simulation data 167 may include electrical parameter data (e.g., impedance, voltage, current, resistance, reflective, signal reflection, etc.) associated with the matching network model 172 and the processing chamber model 174. The simulation data 167 may further include predicted property data of the digital replica model of the manufacturing equipment 130 (e.g., of products to be produced or that have been produced using the current trace data 154). The simulation data 167 may further include predicted metrology data (e.g., virtual metrology data) of the products to be produced or that have been produced using the current trace data 154. The simulation data 167 may further include an indication of abnormalities (e.g., abnormal products, abnormal components, abnormal manufacturing equipment 130, abnormal energy usage, etc.) and one or more causes of the abnormalities. The simulation data 167 may further include an indication of an end of life of a component of manufacturing equipment 130. The simulation data may be all encompassing, covering every mechanical and electrical aspect of the manufacturing equipment.

The predictive server 112 may include a predictive component 114. In some embodiments, the predictive component 114 may receive simulation data 167 and current trace data 154 (e.g., processing chamber flow, processing chamber pressure, RF power, etc.) and generate output (e.g., predictive data 168) for performing corrective action associated with the manufacturing equipment 130. In some embodiments, the predictive component 114 may use one or more trained machine learning models 190 to determine the output for performing the corrective action based on the simulation data 167 and current trace data 154. In some embodiments, the predictive component 114 receives simulation data 167 and current trace data 154, performs signal processing to break down the current trace data 154 into sets of current component data 156 mapped to current component identifiers 158, provides the sets of current component data 156 and the current component identifiers 158 as input to a trained machine learning model 190, and obtains outputs indicative of predictive data 168 from the trained machine learning model 190. The trained machine learning model 190 may include a single model, or multiple models. In some embodiments, the trained machine learning model 190 may use additional data from the data store 140 (e.g., library data 166, performance data 160, sensor data 142, etc.)

In some embodiments, simulation system 110 further includes server machine 180. Server machine 180 may, using a data set generator, generate one or more data sets (e.g., a set of data inputs and a set of target outputs) to train, validate, and/or test a machine learning model(s) 190. In particular, server machine 180 can include a training engine 182, a validation engine 184, selection engine 185, and/or a testing engine 186. An engine (e.g., training engine 182, a validation engine 184, selection engine 185, and a testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 may be capable of training one or more machine learning model 190 using one or more sets of features associated with the training set from data set generator 172. The training engine 182 may generate multiple trained machine learning models 190, where each trained machine learning model 190 corresponds to a distinct set of features of the training set (e.g., sensor data from a distinct set of sensors). For example, a first trained machine learning model may have been trained using all features (e.g., X1-X5), a second trained machine learning model may have been trained using a first subset of the features (e.g., X1, X2, X4), and a third trained machine learning model may have been trained using a second subset of the features (e.g., X1, X3, X4, and X5) that may partially overlap the first subset of features.

The validation engine 184 may be capable of validating a trained machine learning model 190 using a corresponding set of features of the validation set from data set generator. For example, a first trained machine learning model 190 that was trained using a first set of features of the training set may be validated using the first set of features of the validation set. The validation engine 184 may determine an accuracy of each of the trained machine learning models 190 based on the corresponding sets of features of the validation set. The validation engine 184 may discard trained machine learning models 190 that have an accuracy that does not meet a threshold accuracy. In some embodiments, the selection engine 185 may be capable of selecting one or more trained machine learning models 190 that have an accuracy that meets a threshold accuracy. In some embodiments, the selection engine 185 may be capable of selecting the trained machine learning model 190 that has the highest accuracy of the trained machine learning models 190.

The testing engine 186 may be capable of testing a trained machine learning model 190 using a corresponding set of features of a testing set from data set generator. For example, a first trained machine learning model 190 that was trained using a first set of features of the training set may be tested using the first set of features of the testing set. The testing engine 186 may determine a trained machine learning model 190 that has the highest accuracy of all of the trained machine learning models based on the testing sets.

The machine learning model 190 may refer to the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that captures these patterns. The machine learning model 190 may use one or more of Support Vector Machine (SVM), Radial Basis Function (RBF), clustering, supervised machine learning, semi-supervised machine learning, unsupervised machine learning, k-Nearest Neighbor algorithm (k-NN), linear regression, random forest, neural network (e.g., artificial neural network), etc.

Predictive component 114 may provide simulation data 167 and current sensor data 152 to the trained machine learning model 190 and may run the trained machine learning model 190 on the input to obtain one or more outputs. The predictive component 114 may be capable of determining (e.g., extracting) predictive data 168 from the output of the trained machine learning model 190

For purpose of illustration, rather than limitation, aspects of the disclosure describe the training of one or more machine learning models 190 and inputting simulation data 167 and sensor data 142 into the one or more trained machine learning models 190 to determine predictive data 168. In other implementations, a heuristic model or rule-based model is used to determine predictive data 168 (e.g., without using a trained machine learning model). Predictive component 114 may monitor historical sensor data 144 and historical performance data 162. Any of the information described with respect to data from the data store 140 may be monitored or otherwise used in the heuristic or rule-based model.

In some embodiments, the functions of client device 120, predictive server 112, digital representation server 170, and server machine 180 may be provided by a fewer number of machines. For example, in some embodiments, digital representation server 170 and server machine 180 may be integrated into a single machine, while in some other embodiments, digital representation server 170 and server machine 180, and predictive server 112 may be integrated into a single machine. In some embodiments, client device 120 and predictive server 112 may be integrated into a single machine.

In general, functions described in one embodiment as being performed by client device 120, predictive server 112, digital representation server 170 and server machine 180 can also be performed on predictive server 112 in other embodiments, if appropriate. In addition, the functionality attributed to a particular component can be performed by different or multiple components operating together. For example, in some embodiments, the predictive server 112 may determine the corrective action based on the predictive data 168. In another example, client device 120 may determine the predictive data 168 based on output from the trained machine learning model.

In addition, the functions of a particular component can be performed by different or multiple components operating together. One or more of the predictive server 112, digital representation server 170 and server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Embodiments of the disclosure may be applied to data quality evaluation, feature enhancement, model evaluation, Virtual Metrology (VM), Predictive Maintenance (PdM), limit optimization, or the like.

Although embodiments of the disclosure are discussed in terms of generating predictive data 168 to perform a corrective action in manufacturing facilities (e.g., semiconductor manufacturing facilities), embodiments may also be generally applied to characterizing and monitoring components. Embodiments may be generally applied to characterizing and monitoring based on different types of data.

The client device 120, manufacturing equipment 130, sensors 126, metrology equipment 128, predictive server 112, data store 140, digital representation server 170, and server machine 180 may be coupled to each other via a network 105 for generating predictive data 168 to perform corrective actions.

In some embodiments, network 105 is a public network that provides client device 120 with access to the predictive server 112, data store 140, and other publically available computing devices. In some embodiments, network 105 is a private network that provides client device 120 access to manufacturing equipment 130, sensors 126, metrology equipment 128, data store 140, and other privately available computing devices. Network 105 may include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 120 may include a computing device such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. The client device 120 may include a corrective action component 122. Corrective action component 122 may receive user input (e.g., via a Graphical User Interface (GUI) displayed via the client device 120) of an indication associated with manufacturing equipment 130. In some embodiments, the corrective action component 122 transmits the indication to the simulation system 110, receives output (e.g., predictive data 168) from the simulation system 110, determines a corrective action based on the output, and causes the corrective action to be implemented. In some embodiments, the corrective action component 122 obtains sensor data 142 (e.g., current trace data 154) associated with the manufacturing equipment 130 (e.g., from data store 140, etc.) and provides the sensor data 142 (e.g., current trace data 154) associated with the manufacturing equipment 130 to the simulation system 110. In some embodiments, the corrective action component 122 stores sensor data 142 in the data store 140 and the predictive server 112 retrieves the sensor data 142 from the data store 140. In some embodiments, the predictive server 112 may store output (e.g., predictive data 168) of the trained machine learning model (s) 190 in the data store 140 and the client device 120 may retrieve the output from the data store 140. In some embodiments, the corrective action component 122 receives an indication of a corrective action from the simulation system 110 and causes the corrective action to be implemented. Each client device 120 may include an operating system that allows users to one or more of generate, view, or edit data (e.g., indication associated with manufacturing equipment 130, corrective actions associated with manufacturing equipment 130, etc.).

Performing manufacturing processes that result in defective products can be costly in time, energy, products, components, manufacturing equipment 130, the cost of identifying the defects and discarding the defective product, etc. By inputting sensor data 142 (e.g., manufacturing parameters that are being used or are to be used to manufacture a product), receiving output of predictive data 168, and performing a corrective action based on the predictive data 168, system 100 can have the technical advantage of avoiding the cost of producing, identifying, and discarding defective products.

Performing manufacturing processes that result in failure of the components of the manufacturing equipment 124 can be costly in downtime, damage to products, damage to equipment, express ordering replacement components, etc. By inputting sensor data 142 (e.g., manufacturing parameters that are being used or are to be used to manufacture a product), receiving output of predictive data 168, and performing corrective action (e.g., predicted operational maintenance, such as replacement, processing, cleaning, etc. of components) based on the predictive data 168, system 100 can have the technical advantage of avoiding the cost of one or more of unexpected component failure, unscheduled downtime, productivity loss, unexpected equipment failure, product scrap, or the like.

Corrective action may be associated with one or more of Computational Process Control (CPC), Statistical Process Control (SPC) (e.g., SPC on electronic components to determine process in control, SPC to predict useful lifespan of components, SPC to compare to a graph of 3-sigma, etc.), Advanced Process Control (APC), model-based process control, preventative operative maintenance, design optimization, updating of manufacturing parameters, feedback control, machine learning modification, or the like. In some embodiments, the corrective action may include adjusting one or more of the controllable variable tuning elements of the matching network 134. This will be explained in further detail below.

In some embodiments, the corrective action includes providing an alert (e.g., an alarm to stop or not perform the manufacturing process if the predictive data 168 indicates a predicted abnormality, such as an abnormality of the product, a component, or manufacturing equipment 130). In some embodiments, the corrective action includes providing feedback control (e.g., modifying a manufacturing parameter responsive to the predictive data 168 indicating a predicted abnormality). In some embodiments, the corrective action includes providing machine learning (e.g., modifying one or more manufacturing parameters based on the predictive data 168). In some embodiments, performance of the corrective action includes causing updates to one or more manufacturing parameters.

Manufacturing parameters may include hardware parameters (e.g., replacing components, using certain components, replacing a processing chip, updating firmware, etc.) and/or process parameters (e.g., temperature, pressure, flow, rate, electrical current, voltage, gas flow, lift speed, etc.). In some embodiments, the corrective action includes causing preventative operative maintenance (e.g., replace, process, clean, etc. components of the manufacturing equipment 130). In some embodiments, the corrective action includes causing design optimization (e.g., updating manufacturing parameters, manufacturing processes, manufacturing equipment 130, etc. for an optimized product). In some embodiments, the corrective action includes updating a recipe (e.g., manufacturing equipment 130 to be in an idle mode, a sleep mode, a warm-up mode, etc.).

Figure 2:
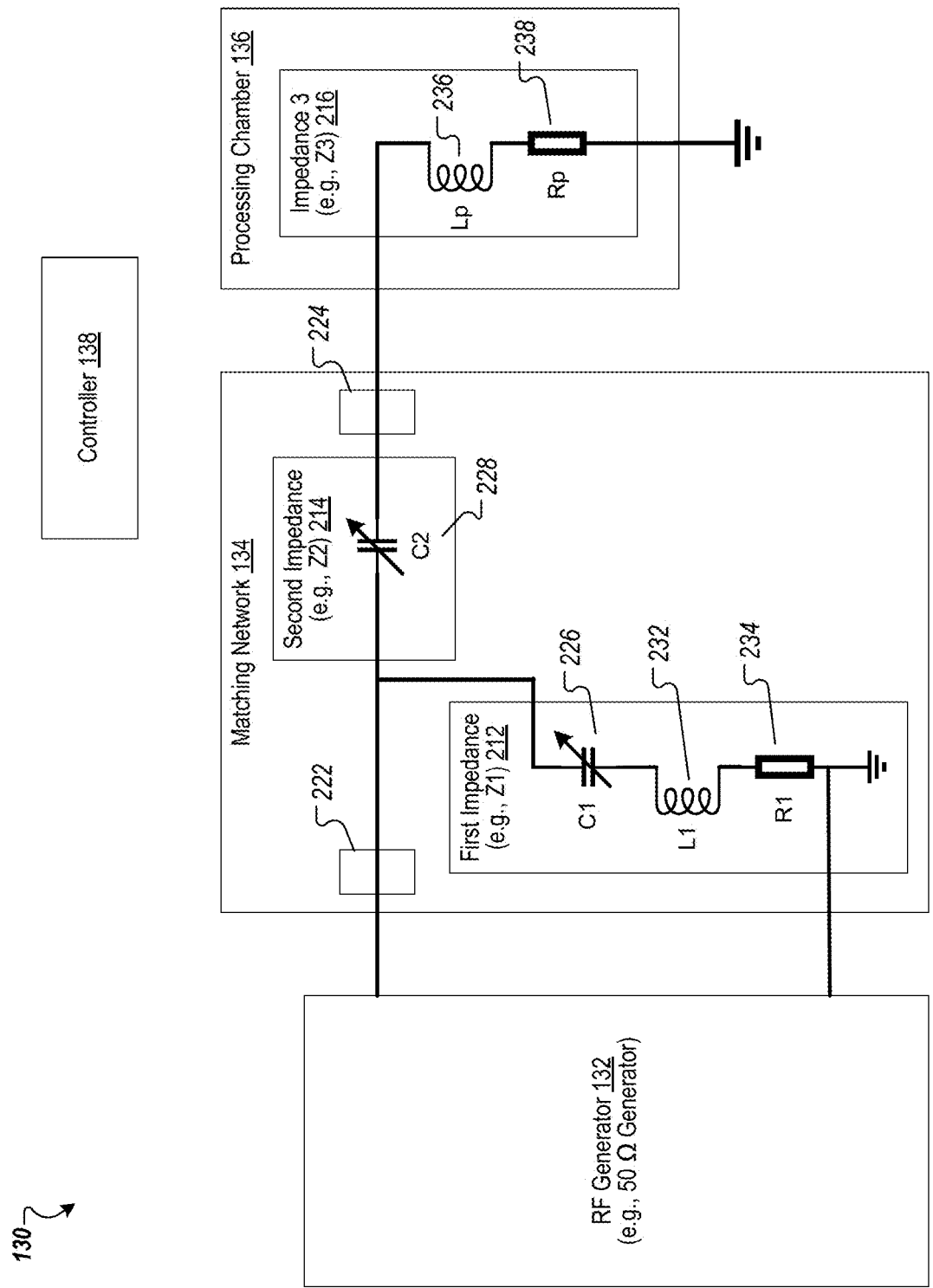
FIG. 2 is a block diagram illustrating an exemplary embodiment of the manufacturing equipment in greater detail, according to certain embodiments.

FIG. 2 is a block diagram illustrating an exemplary embodiment of the manufacturing equipment 130 in greater detail. The components of FIG. 2 are used by way of example for illustrative purposes. Accordingly, different combinations of components, such as insulators, capacitors, resistors, etc., may be used with the embodiments of the present disclosure. As discussed above, the manufacturing equipment 130 includes the RF generator 132, the matching network 134, the processing chamber 136, and the controller 138.

The matching network 126 may include a first capacitor 226 (also referred to as "C1") and second capacitor 228 (also referred to as "C2"). Each of the first capacitor 226 and the second capacitor 228 can be a variable capacitor (tuning or adjustable capacitor) capable of tuning the total impedance of the matching network 134. For example, embodiments of the present disclosure may perform a match tuning by adjusting either or both of the first capacitor 226 and the second capacitor 228 such that the output impedance associated with the processing chamber 136 is adjusted towards the input impedance associated with the RF generator 132 (e.g., 50 ohms). This can maximize the power delivery from the RF generator 132 to the processing chamber 136. In some embodiments, the first capacitor 226 may further be a shunt capacitor while the second capacitor 228 may be a series capacitor. Series capacitors can be used in transmission lines for series compensation to improve the power-handling capabilities. Shunt capacitors can be applied to an electrical system for multiple tasks in one single application. More so, in series capacitors, reactive power generation is proportional to the square of the load current. In shunt capacitors, reactive power generation is proportional to the square of the voltage.

The matching network 134 may include input sensor 222 and output sensor 224. The input sensor 222 may determine the impedance associated with the matching network 134. The output sensor 224 may determine the impedance of the RF signal at the processing chamber 136.

The matching network 126 can be associated with a first impedance 212 (also referred to as "Z1") and a second impedance 214 (also referred to as "Z2"). The first impedance 212 can be associated with the first capacitor 226, resistive elements 234 (also referred to as "R1") and inductance elements 232 (also referred to as "L1") of the parallel path in the matching network 134. The first impedance 212 can be expressed by Equation 1, seen below, where the term j represents the imaginary unit and the term w represents the angular frequency and is expressed as 2*π*f, where f is the frequency of the RF signal (e.g., 2.2 MHz, 13.56 MHz, 100 MHz, etc.):

$$Z1 = R1 + L1*w*j + \frac{1}{C1*w*j} \qquad \text{Equation 1}$$

The second impedance 214 can be associated with the second capacitor 228. In some embodiments, the second impedance 214 is also associated with one or more passive devices (e.g., inductors, resistors, etc.). The second impedance 214 can be expressed by Equation 2, seen below:

$$Z2 = \frac{1}{C2*w*j} \qquad \text{Equation 2}$$

The processing chamber 136 can be associated with a third impedance 216 (also referred to as "Z3"), associated with impedance from processing chamber components, transition line impedance, feeding rod impedance (from the matching network 134 to the process chamber 136), etc. By way of example, Z3 can be expressed using the real parts Rp 238 and the imaginary Lp 236 parts of the impedance associated with the processing chamber 136. The Rp and Lp may be measured, in real-time, using the input impedance sensor 224. The third impedance 216 can be expressed by Equation 3, seen below:

$$Z3 = Rp + Lp*w*j \qquad \text{Equation 3}$$

Accordingly, the total load impedance of the manufacturing equipment 130 can be expressed by Equation 4, see below:

$$Z_{Total} = \frac{Z1 * \frac{(Z2+Z3)}{Z1+Z2+Z3}}{Z1+Z2+Z3} = \frac{\left(R1 + L1*w*j + \frac{1}{C1*w*j}\right)*\left(Rp + Lp*w*j + \frac{1}{C2*w*j}\right)}{R1+Rp+(Lp+L1)*w*j + \frac{1}{C1*w*j} + \frac{1}{C2*w*j}}$$

Equation 4

Figure 3:
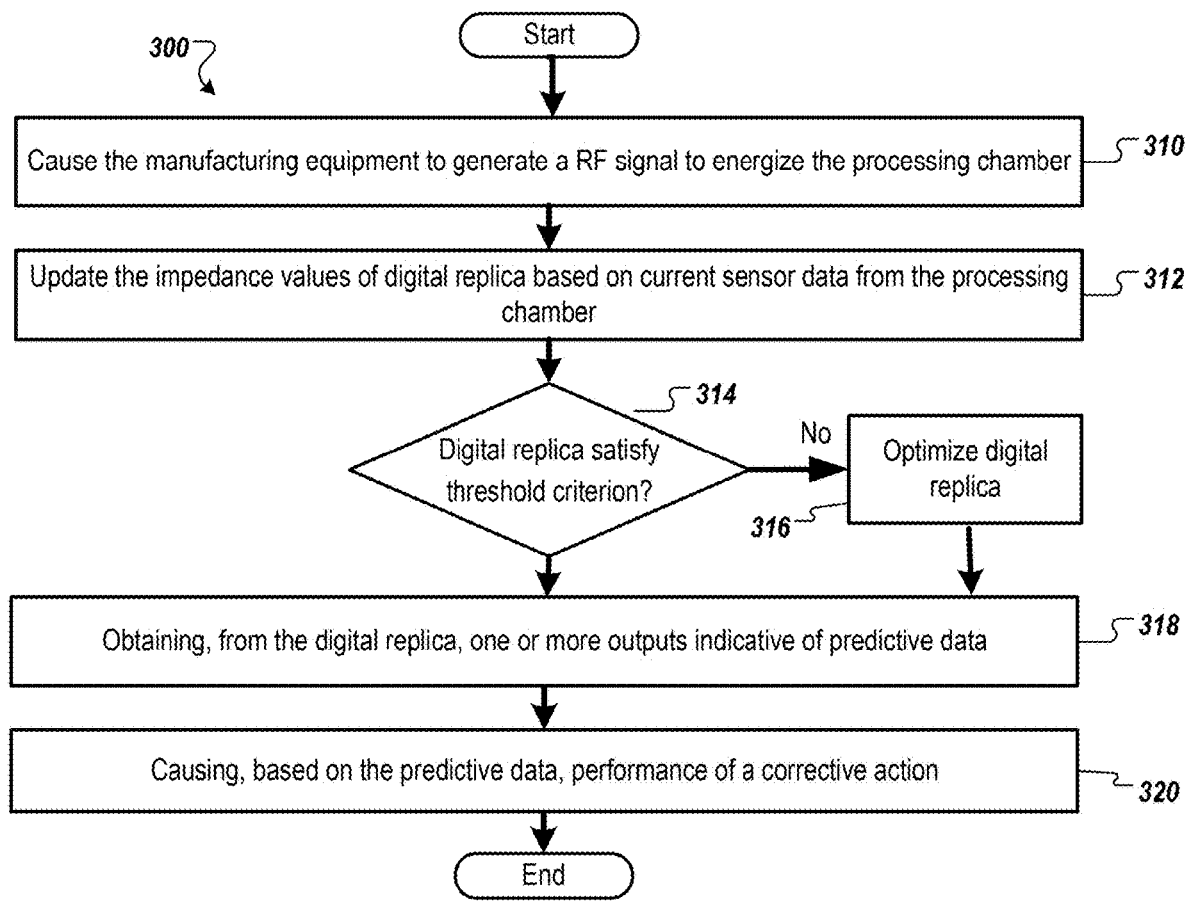
FIG. 3 is a flow diagram for with generating predictive data to cause a corrective action, according to certain embodiments.

FIG. 3 is a flow diagram of a method 300 for generating predictive data to cause a corrective action, according to certain embodiments. Method 300 may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiment, method 300 may be performed, in part, by simulation system 110. In some embodiments, a non-transitory storage medium stores instructions that when executed by a processing device (e.g., of simulation system 110, of server machine 180, of predictive server 112, etc.) cause the processing device to perform of method 300.

For simplicity of explanation, method 300 is depicted and described as a series of operations. However, operations in accordance with this disclosure can occur in various orders and/or concurrently and with other operations not presented and described herein. Furthermore, not all illustrated operations may be performed to implement method 300 in accordance with the disclosed subject matter. In addition, those skilled in the art will understand and appreciate that method 300 could alternatively be represented as a series of interrelated states via a state diagram or events.

At block 310, the processing logic, implementing method 300, cause the RF generator 132 to generate an RF signal to energize the processing chamber.

At block 312, the processing logic updates the impedance values in the digital replica. In particular, the processing logic may update the impedance associated with the matching network model 172 based on the current trace data generated from the input sensor 222, and update the impedance associated with the processing chamber model 174 based on current trace data 154 generated from the output sensor 224.

At block 314, the processing logic may determine whether the digital replica satisfies an accuracy threshold criterion based on the current impedance values. For example, the processing logic may use a cost function formula (e.g., mean difference squared), to determine whether the matching network model 172 and the processing chamber model 174 are within an allowable margin of error.

By way of example, the processing logic may utilize Equation 5, expressed below, where the term J1 represents the allowable margin of error, the term $Z_{input}$ represents the impedance determined by the input sensor 222, and the term angle represents the frequency and phase of the RF signal:

$$J1 = |Z_{input} - Z_{Total}|^2 + (\text{angle}(Z_{input} - Z_{Total}))^2$$

Equation 5

It is understood that the closer the term J1 is to 0, the more accurate the matching network model 172 is to the parameters of the physical elements and the dynamics of the matching network 134. Terms associated with Equation 5 may be subjected to constraints. In some embodiments, the values of the first capacitor 226 and the second capacitor 228 can be subject to upper limits ($C1_{max}$ and $C2_{max}$) and lower limits ($C1_{min}$ and $C2_{min}$), expressed as follows: $C1_{min} < C1 < C1_{max}$; $C2_{min} < C2 < C2_{max}$. Responsive to the digital replica satisfying the threshold criterion (e.g., the matching network model 172 and/or the processing chamber model 174 each being within an allowable margin of error), the processing logic proceeds to block 318. Responsive to the digital replica failing to satisfy the threshold criterion, the processing logic proceeds to block 316.

At block 316, the processing logic optimizes the digital replica. In an embodiment, using Equation 5, the processing logic may determine optimal values of the resistive elements R1 and/or the inductance elements L1 used in the matching network model 172. For example, the processing logic may update the matching network model 172 by adjusting one or more parameters (e.g., L1, R1, C1, C2, etc.) until the term J1 satisfies the accuracy threshold criterion. In an embodiment, the processing logic may update the processing chamber model 174 by adjusting one or more parameters (e.g., $L_p$, $R_p$, etc.) using an updating algorithm. The adjusted parameters may be stored as simulation data 167.

At block 318, the processing logic obtains, from the simulation system 110, one or more outputs indicative of predictive data. For example, the processing logic may determine optimal values for the first capacitor 226 and the second capacitor 228 to minimize the reflected RF signal. In some embodiments, the processing logic may use the predictive component 114 to perform a closed loop simulation using simulation data 167 and a model 190. The predictive component 114 may generate one or more optimization profiles, which may indicate values to which to adjust the first capacitor 226 and the second capacitor 228 in order to minimize the reflected RF signal. In some embodiment, the predictive component 114 may further utilize a tuning time parameter in order to minimize the time necessary to reach the optimal values.

By way of example, processing logic may utilize Equation 6, expressed below, to generate the optimization profile, where.

$$J2 = w_1 \int \left\|\frac{Z-Z0}{Z+Z0}\right\| + w_2 * T_{tune}$$

Equation 6

The term J2 represents the cost function and may be set to the total impedance of the manufacturing equipment 130 (e.g., $Z_{total}$), the term $w_1$ represents the weight coefficient associated with the reflection coefficient $$\left\|\frac{Z-Z0}{Z+Z0}\right\|$$

or γ (gamma)), the term $T_{tune}$ is the tuning time, the term $w_2$ is the weight coefficient associated with the turning time, and the term Z0 represents the target impedance (e.g., impedance of the RF generator 132, such as 50 ohms). In some embodiments, Equation 6 is subject to constraints, expressed as follows:

$$C1_{min} < C1 < C1_{max}; \frac{dC1}{dt} < V_{C1max}(C1 \text{ velocity limit})$$

Constraint 1

-continued $$C2_{min} < C2 < C2_{max}; \frac{dC2}{dt} < V_{C2max} \text{ (C2 velocity limit)} \quad \text{Constraint 2}$$

$$T_{tune} \text{ is defined as } \gamma < 0.05, \text{ where } \left\|\frac{Z-Z0}{Z+Z0}\right\| \quad \text{Constraint 3}$$

The predictive server may use Equation 6 to generate one or more optimization profiles for the first capacitor 226 and the second capacitor 228. The optimization profiles may indicate reflective coefficient values for each tuning combination of the first capacitor 226 and the second capacitor 228. The optimization profiles may further indicate tuning path to reach capacitor target values. The capacitor target values may be setting parameters for the first capacitor 226 and the second capacitor 228 that have the lowest achievable reflection coefficient.

Figure 4A:
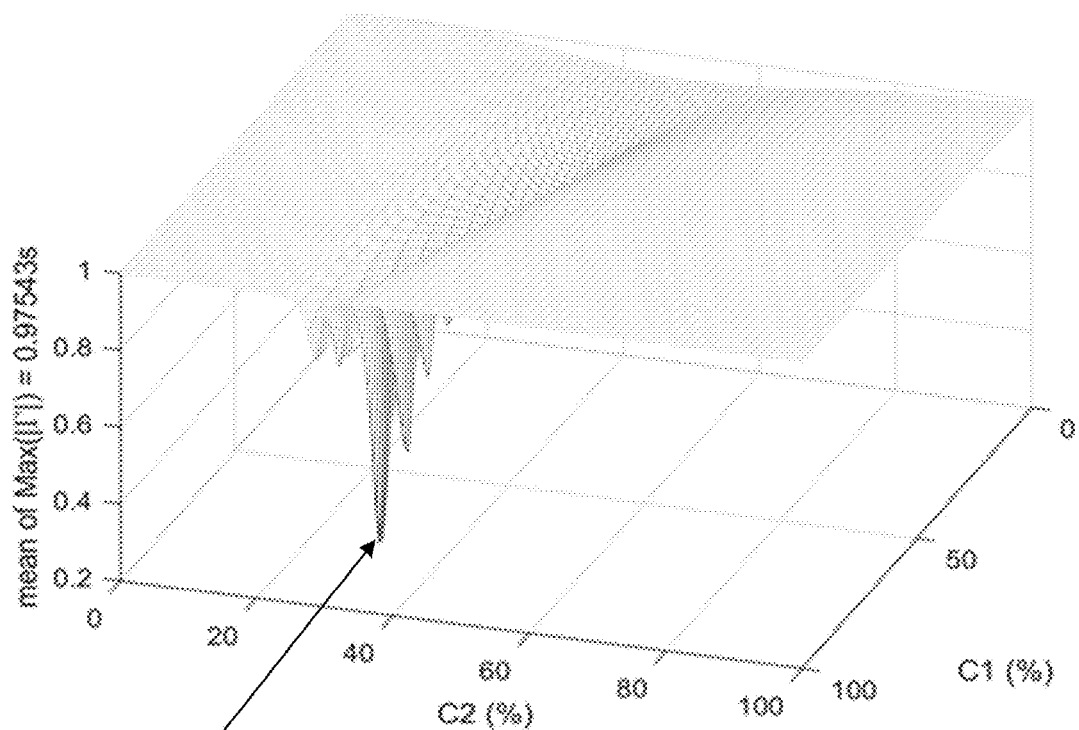
FIGS. 4A-C are graphs illustrating example optimization profiles, according to certain embodiments.
Figure 4B:
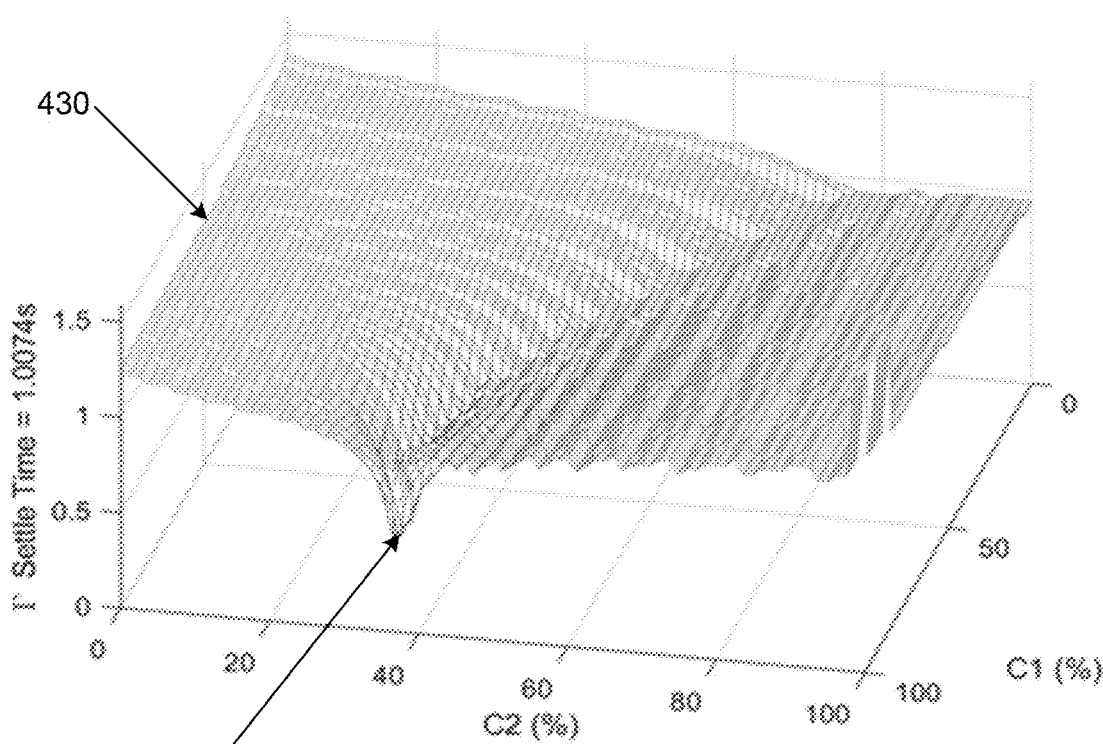
Figure 4C:
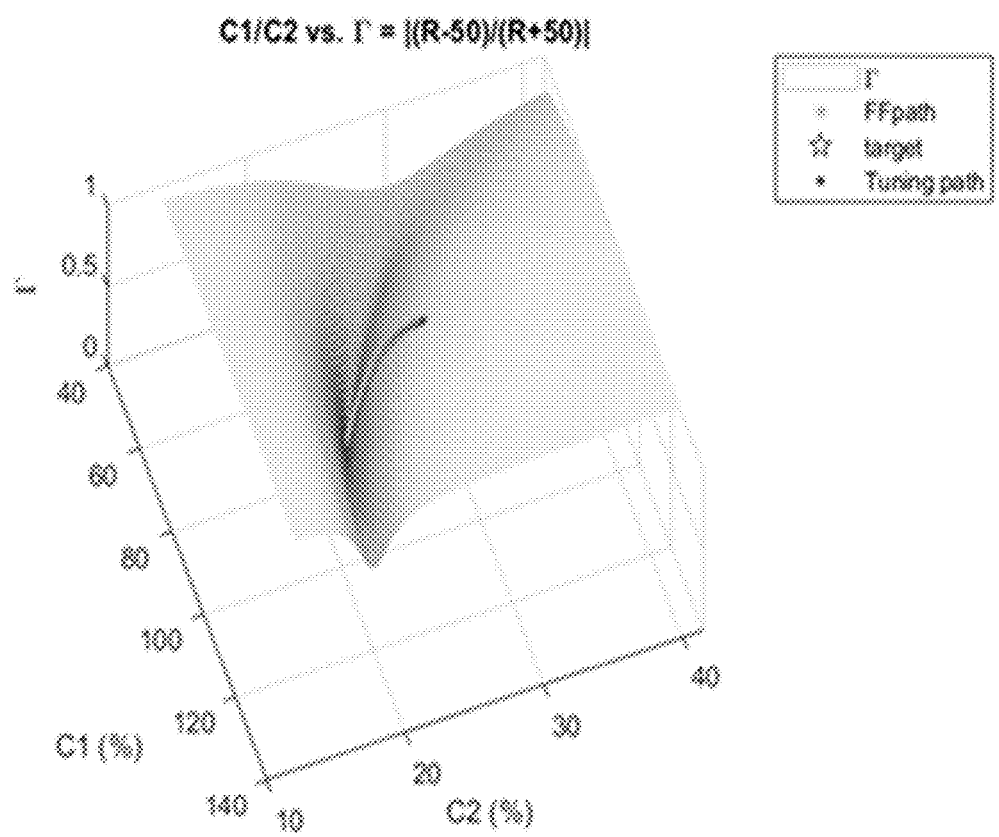

FIGS. 4A-C are graphs illustrating example optimization profiles, according to certain embodiments. Specifically, FIG. 4A illustrates a reflection coefficient ($\gamma$) value for each initial tune value (e.g., from 0 to 100%) of the first capacitor 226 and the second capacitor 228. Point 410 indicates the lowest achievable reflection coefficient of the optimization profile, which is associated with the first capacitor 226 tuned to approximately 86% and the second capacitor tuned to approximately 30% (capacitor target values).

FIG. 4B illustrates the duration required to reach the capacitor target values for each set of initial values for the first capacitor 226 and the second capacitor 228. For example, if the first capacitor 226 has a tune value of 50% and the second capacitor 228 has a tune value of 0% (e.g., point 430), then the corrective action component 122 requires 1.25 second to tune the first capacitor 226 and the second capacitor 228 to the capacitor target values (e.g., 86% and 30% respectively).

FIG. 4C illustrates a gradient-based match tuning optimization profile. The gradient-based match tuning optimization profile may be defined by the following cost function:

$$J = \frac{1}{2}[\text{abs}(\frac{Z-50}{Z+50})]^2 + \frac{1}{2}[\text{angle}(\frac{Z-50}{Z+50})]^2 \quad \text{Equation 7}$$

By taking partial derivatives of the cost function in Equation 7, control parameters for the optimization model can be determined. For example, the following equations show the partial derivatives of the cost function:

$$\frac{\partial J}{\partial C1} = f1(C1, C2, Lp, Rp, L1, w) \quad \text{Equation 8}$$

$$\frac{\partial J}{\partial C2} = f2(C1, C2, Lp, Rp, L1, w)$$

The partial derivatives may lead to gradient control values that dictate the gradient tuning. For example, the gradient control law may lead to the following gradient controls:

$$\frac{dC1}{dt} = \begin{cases} g_1, & \text{if } f1(C1, C2, Lp, Rp, L1, w) < -c1 \\ \frac{k_1 *}{[50-\text{abs}(Z)]} & \text{if } |f1(C1, C2, Lp, Rp, L1, w)| < c1 \\ -g_1, & \text{if } f1(C1, C2, Lp, Rp, L1, w) > c1 \end{cases} \quad \text{Equation 10}$$

$$\frac{dC2}{dt} = \begin{cases} g_2, & \text{if } f2(C1, C2, Lp, Rp, L1, w) < -c2 \\ \frac{-k_2 *}{\text{angle}(Z)} & \text{if } |f2(C1, C2, Lp, Rp, L1, w)| < c2 \\ -g_2, & \text{if } f2(C1, C2, Lp, Rp, L1, w) > c2 \end{cases} \quad \text{Equation 11}$$

The positive parameters $k_1$, $k_2$, $g_1$, and $g_2$ are controller gains. The values of c1 and c2 are the threshold of switching from gradient control to linear control. For example the switching between gradient control and linear control may be used to remove or otherwise mitigate chattering or noise during a steady state portion of the optimization profile.

In some embodiments, the optimization profile may be based on a Jacobian-based RF match tuning algorithm. In the context of controlling the RF match, a Jacobian can predict abrupt changes in the capacitance (e.g. first capacitor C1 226 and second capacitor C2 228 of FIG. 2) caused by past and future iterations of the optimization profile. As noted previously, a matching network (e.g., matching network 134 of FIG. 1) may operate to minimize reflected RF energy by matching the impedance of the plasma used in the etching process to the impedance of the RF signal. For example, a desired real value impedance (e.g., 50 Ohms, 75 Ohms, etc.) may matched by the plasma. Using equation 4, the input impedance may expressed as the following:

$$Z = \frac{Z_1(Z_2 + Z_3)}{Z_1 + Z_2 + Z_3} = Z_r + jZ_i \quad \text{Equation 12}$$

From Equation 12, a Jacobian matrix can be calculated by the following:

$$J_c = \begin{bmatrix} \frac{\partial \|Z\|}{\partial C_1} & \frac{\partial \text{atan2}(Z_r, Z_i)}{\partial C_1} \\ \frac{\partial \|Z\|}{\partial C_2} & \frac{\partial \text{atan2}(Z_r, Z_i)}{\partial C_2} \end{bmatrix} \quad \text{Equation 13}$$

In some embodiments, a Jacobian controller can used as defined by the following:

$$C(t) = \int_0^t J_c^{-1} K e(t) \quad \text{Equation 14}$$

where C(t)=[C1 C2], e(t)=[50−abs(Z); −angle(Z)], and K is positive definite gain matrix (e.g., Equation 13). In a further embodiments, the Jacobian, $J_c$, may be modified to adjust the loop gains of a magnitude-phase control system.

In a further embodiment, a damping constant, $\lambda$, may be used to prevent a singularity in the inverse calculation of the Jacobian matrix, $J_c$, and further cause determining the inverse Jacobian matrix more tractable by the processing logic. In another embodiment, non-direct matrix solvers can be used to calculate and update tuning values without solving for the inverse Jacobian matrix directly. For example, methods such as a matrix least squares solution, iterative solvers, and matrix decomposition solvers (e.g., upper and lower triangular solvers, singular value decomposition, and the like) can be used, as will be discussed further in other embodiments.

In some embodiments decentralized control of the optimization profile can be utilized through Singular Value Decomposition (SVD). For example, an SVD of the Jacobian matrix can be expressed as the following:

$$J_c = UDV^T \quad \text{Equation 15}$$

U and V are orthogonal matrices and D is a diagonal matrix. For example, D only contains non-zero values along the diagonal elements (e.g. $\sigma_i = d_{i,j}$, along the diagonal) of the matrix. In the absence of a singularity, the diagonal elements decrease down the row and across the columns of the matrix (e.g., $\sigma_1 \geq \sigma_2 \ldots > 0$). As a result of having D set as a diagonal matrix, the control of the optimization model is decentralized. For example, the magnitude control loop and phase control loop of the impedance can be tuned independently by adjusting one or more gains of the diagonal matrix D.

In some embodiments, the RF match circuit optimization model may not meet a threshold precision. For example, the optimization models (e.g., FIGS. 4A-C) described herein may be dependent on values (e.g., theoretical or generalized values) that misrepresent unique characteristics of a specific RF match circuit. In some embodiments, the following calibration can be used to more accurately measure parameters and values to determine and predict more precise optimization profiles.

Processing logic may follow a calibration procedure to update optimization parameters (e.g., to improve accuracy and precision of the optimization profile). Processing logic may use an RF match auto-tune mode to find tune position of a first capacitor (e.g., a shunt capacitor C1) and a second capacitor (e.g., a series capacitor C2). The processing logic can measure the Jacobian using perturbation calculations of the tuned impedance position. For example, processing logic may move C1/C2 to the matched positions (e.g., by setting the RF match to a manual control). While keeping C2 unchanged, processing logic may calculate an impedance across a C1 delta (e.g., $\delta_{c_1}=0.5$). In this example, processing logic moves C1 to C1+$\delta_{c_1}$ and reads the input impedance, $R_1$, for a short duration (e.g., 10 seconds). Processing logic may move C1 to C1−$\delta_{c_1}$ and read match input impedance, $R_2$, for a short duration (e.g., 10 seconds). While keeping C1 unchanged, processing logic may calculate an impedance across a C2 delta (e.g., $\delta_{c_2}=0.5$). In this example, processing logic moves C2 to C2+$\delta_{c_2}$ and reads the input impedance, $R_3$, for a short duration (e.g., 10 seconds). Processing logic may move C2 to C2−$\delta_{c_2}$ and read match input impedance, $R_4$, for a short duration (e.g., 10 seconds). The processing logic may then calculate the Jacobian using the following equations and parameter values as described in this calibration example.

$$\delta_{c_1\,mag} = \frac{\text{abs}(R_1) - \text{abs}(R_2)}{2*\delta_{c_1}}$$

$$\delta_{c_1\,phase} = \frac{\text{angle}(R_1) - \text{angle}(R_2)}{2*\delta_{c_1}}$$

$$\delta_{c_2\,mag} = \frac{\text{abs}(R_3) - \text{abs}(R_4)}{2*\delta_{c_2}}$$

$$\delta_{c_2\,phase} = \frac{\text{angle}(R_3) - \text{abs}(R_4)}{2*\delta_{c_2}}$$

$$J_c = [\delta_{c_2\,mag}, \delta_{c_1\,phase}, \delta_{c_2\,mag}, \delta_{c_2\,phase}]$$

Equations 16-20

The Jacobian identified in Equation 20 may then be used in association with other optimization profiles (e.g., SVD, damping, etc.), as discussed herein.

In some embodiments, the processing logic may continue generating predictive data (e.g., optimization profiles) until said data satisfies a threshold criterion based on the weighing coefficients. In particular, the weighting coefficients may be set to 1 (e.g., $w_1+w_2=1$ or 100%). A user may alter the weighing coefficients based on a preference for minimal reflective power against tuning time. For example, if the user prioritizes minimizing match tuning time, the user may set $w_2$ to a high value. If the user prioritizes minimizing reflected power, the user may set $w_1$ to a high value.

Figure 5:
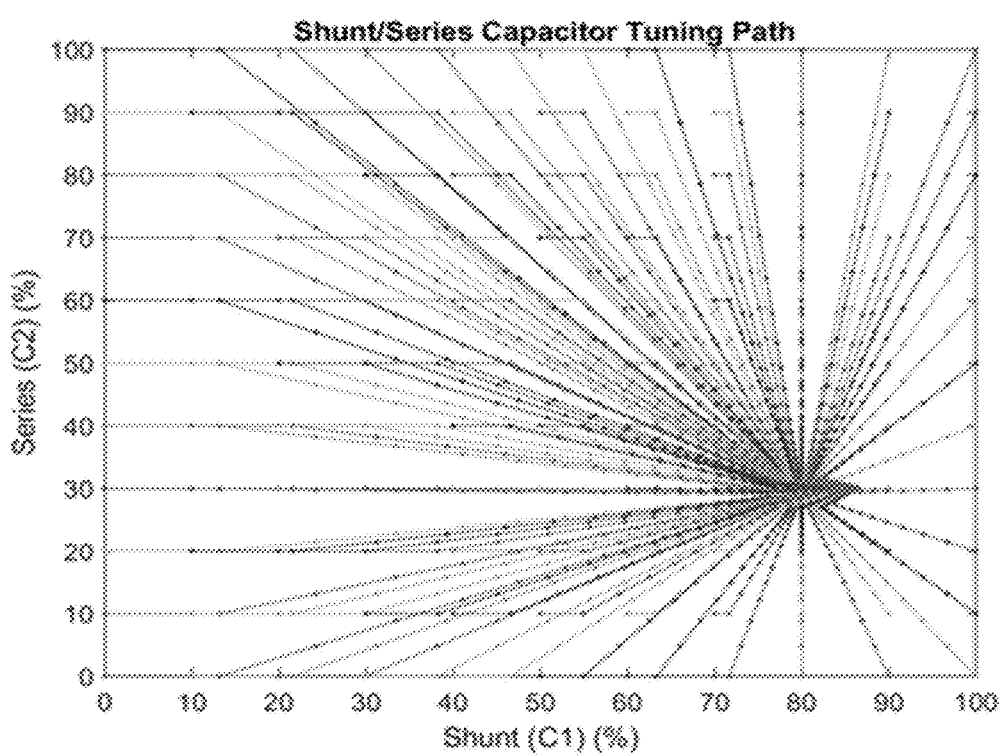
FIG. 5 is a graph illustrating multiple tuning paths associated two variable capacitors, according to certain embodiments.

At block 320, the processing logic causes, based on the predictive data, performance of a corrective action. For example, the processing logic can select a tuning path from the optimization profile. The controller 138 may adjust the first capacitor 226 and/or the second capacitor 228 based on the tuning path. FIG. 5 is a graph illustrating multiple tuning paths associated with the first capacitor 226 and/or the second capacitor 228. In particular, FIG. 5 shows tuning path towards the capacitor target values for each initial tune value (e.g., from 0 to 100%) of the first capacitor 226 and the second capacitor 228.

Figure 6:
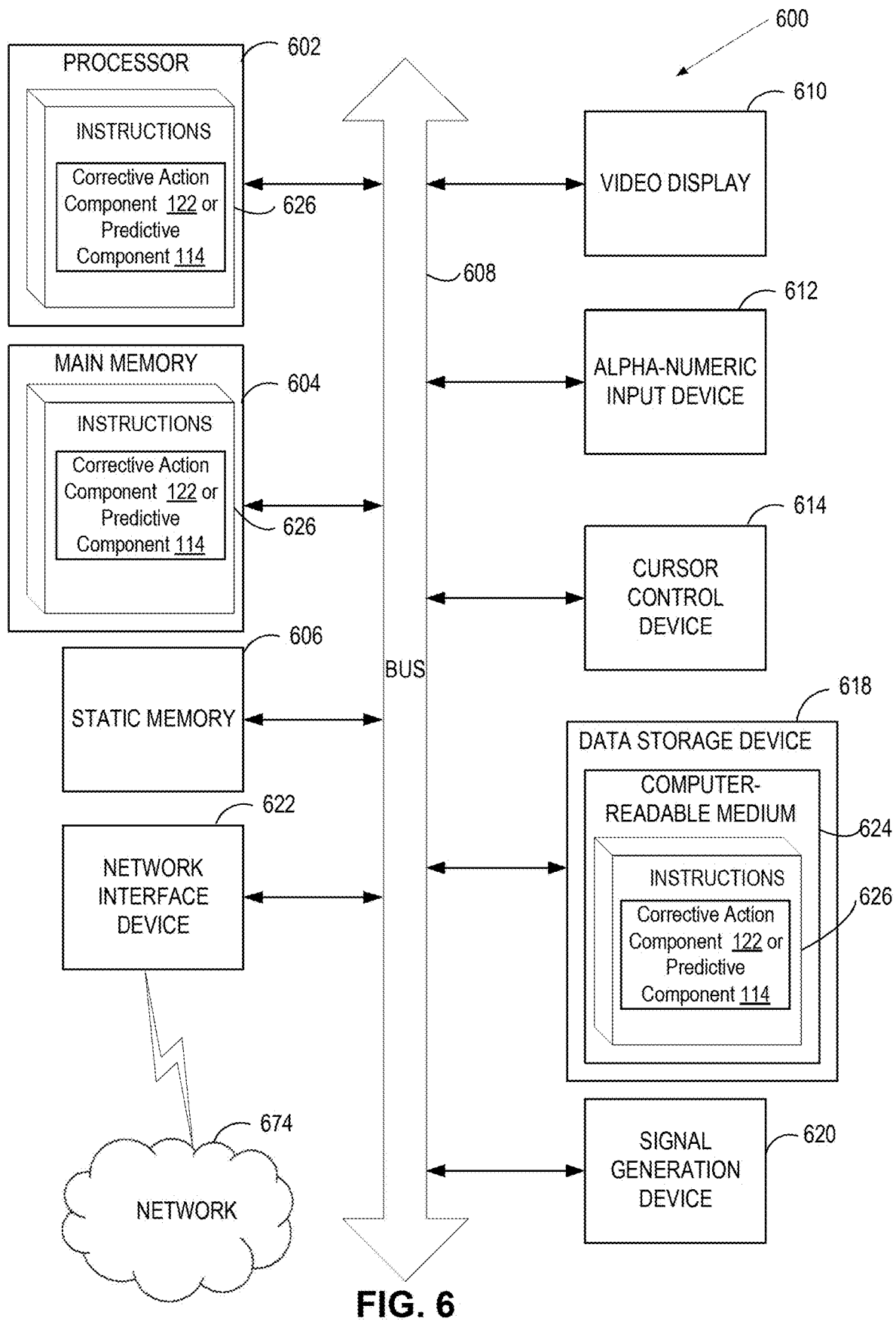
FIG. 6 is a block diagram illustrating a computer system, according to certain embodiments.

FIG. 6 is a block diagram illustrating a computer system 600, according to certain embodiments. In some embodiments, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 616, which may communicate with each other via a bus 608.

Processing device 602 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 may further include a network interface device 622 (e.g., coupled to network 674). Computer system 600 also may include a video display unit 610 (e.g., an LCD), an alphanumeric input device 612 (e.g., a keyboard), a cursor control device 614 (e.g., a mouse), and a signal generation device 620.

In some implementations, data storage device 616 may include a non-transitory computer-readable storage medium 624 on which may store instructions 626 encoding any one or more of the methods or functions described herein, including instructions encoding components of FIG. 1 (e.g., corrective action component 122, predictive component 114, etc.) and for implementing methods described herein.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

The invention claimed is:

1. A method comprising:
   receiving, from one or more sensors, sensor data associated with manufacturing equipment;
   updating one or more values of a digital replica associated with the manufacturing equipment based on the sensor data, wherein the digital replica comprises a trained machine-learning_model reflecting a virtual representation of physical elements and dynamics of how the manufacturing equipment operates;
   obtaining, from the digital replica, one or more outputs indicative of predictive data; and
   causing, based on the predictive data, performance of one or more corrective actions associated with the manufacturing equipment.

2. The method of claim 1, further comprising:
   responsive to determining that digital replica fails to satisfy an accuracy threshold criterion based on the sensor data, performing an optimization of the digital replica.

3. The method of claim 1, wherein updating the one or more values of the digital replica comprises:
   updating a processing chamber model associated with the digital replica using sensor data from an output sensor, wherein the output sensor is associated with a matching network of the manufacturing equipment.

4. The method of claim 1, wherein updating the one or more values of the digital replica comprises:
   updating a matching network model associated with the digital replica using sensor data from an input sensor and an output sensor, wherein the input sensor and the output sensor are associated with a matching network of the manufacturing equipment.

5. The method of claim 1, wherein the predictive data comprises one or more tune settings for one or more variable capacitors associated with a matching network of the manufacturing equipment.

6. The method of claim 1, wherein the corrective action comprises adjusting one or more variable capacitors associated with a matching network of the manufacturing equipment based on the predictive data.

7. A system comprising:
   a memory; and
   a processing device, coupled to the memory, to:
   receive, from one or more sensors, sensor data associated with manufacturing equipment;
   update one or more values of a digital replica associated with the manufacturing equipment based on the sensor data, wherein the digital replica comprises a trained machine-learning_model reflecting a virtual representation of physical elements and dynamics of how the manufacturing equipment operates;
   obtain, from the digital replica, one or more outputs indicative of predictive data; and
   cause, based on the predictive data, performance of one or more corrective actions associated with the manufacturing equipment.

8. The system of claim 7, wherein the processing device is further to:
   responsive to determining that digital replica fails to satisfy an accuracy threshold criterion based on the sensor data, perform an optimization of the digital replica.

9. The system of claim 7, wherein to update the one or more values of the digital replica, the processing device is further to:
   update a processing chamber model associated with the digital replica using sensor data from an output sensor, wherein the output sensor is associated with a matching network of the manufacturing equipment.

10. The system of claim 7, wherein to update the one or more values of the digital replica, the processing device is further to:

update a matching network model associated with the digital replica using trace data from an input impedance sensor and an output impedance sensor, wherein the input impedance sensor and the output impedance sensor are associated with a matching network of the manufacturing equipment.

11. The system of claim 7, wherein the predictive data comprises one or more tune settings for one or more variable capacitors associated with a matching network of the manufacturing equipment.

12. The system of claim 7, wherein the corrective action comprises adjusting one or more variable capacitors associated with a matching network of the manufacturing equipment based on the predictive data.

13. A non-transitory machine-readable storage medium storing instructions which, when executed cause a processing device to perform operations comprising:
receiving, from one or more sensors, sensor data associated with manufacturing equipment;
updating one or more values of a digital replica associated with the manufacturing equipment based on the sensor data, wherein the digital replica comprises a trained machine-learning model reflecting a virtual representation of physical elements and dynamics of how the manufacturing equipment operates;
obtaining, from the digital replica, one or more outputs indicative of predictive data; and
causing, based on the predictive data, performance of one or more corrective actions associated with the manufacturing equipment.

14. The non-transitory machine-readable storage medium of claim 13, wherein the operations further comprise:
responsive to determining that digital replica fails to satisfy an accuracy threshold criterion based on the sensor data, performing an optimization of the digital replica.

15. The non-transitory machine-readable storage medium of claim 13, wherein updating the one or more values of the digital replica comprises:
updating a processing chamber model associated with the digital replica using sensor data from an output sensor, wherein the output sensor is associated with a matching network of the manufacturing equipment.

16. The non-transitory machine-readable storage medium of claim 13, wherein updating the one or more values of the digital replica comprises:
updating a matching network model associated with the digital replica using sensor data from an input sensor and an output sensor, wherein the input sensor and the output sensor are associated with a matching network of the manufacturing equipment.

17. The non-transitory machine-readable storage medium of claim 13, wherein the predictive data comprises one or more tune settings for one or more variable capacitors associated with a matching network of the manufacturing equipment, and wherein the corrective action comprises adjusting one or more variable capacitors associated with a matching network of the manufacturing equipment based on the predictive data.

* * * * *